United States Patent

Morita

[11] Patent Number: 6,051,988
[45] Date of Patent: Apr. 18, 2000

[54] PULSE WIDTH CONTROLLING LOGIC CIRCUIT

[75] Inventor: Takayoshi Morita, Sapporo, Japan

[73] Assignee: Fujitsu Limited, Kanagawa, Japan

[21] Appl. No.: 09/033,197

[22] Filed: Mar. 2, 1998

[30] Foreign Application Priority Data

Oct. 7, 1997 [JP] Japan ..................................... 9-274796

[51] Int. Cl.[7] ................................................. H03K 19/00
[52] U.S. Cl. ................................ 326/29; 326/31; 326/82; 327/172
[58] Field of Search ................................ 326/82–83, 84, 326/89, 31–34, 29; 327/172–174, 419, 427, 434, 437, 170

[56] References Cited

U.S. PATENT DOCUMENTS

| | | | |
|---|---|---|---|
| 4,071,781 | 1/1978 | Kayalioglu | 327/172 |
| 4,398,154 | 8/1983 | Lee | 327/174 |
| 4,710,904 | 12/1987 | Suzuki | 327/172 |

FOREIGN PATENT DOCUMENTS 53-60550  5/1978  Japan .

*Primary Examiner*—Jon Santamauro
*Attorney, Agent, or Firm*—Helfgott & Karas, P.C.

[57] ABSTRACT

An input pulse signal is applied to an input terminal of a pulse width controlling logic circuit and integrated by an integrating circuit. A desired output signal is obtained at an output terminal via a C-MOS logic element having an input threshold level that depends on a power supply voltage applied thereto, and an ACC circuit. An average level detecting unit detects an average level of the input pulse signal so that an average level converting unit supplied with an output from the average level detecting unit controls the power supply voltage applied to the C-MOS logic element. The pulse width controlling logic circuit operates on a principle that, as a pulse width is decreased, an average level of the pulse is lowered, and, as a pulse width is increased, an average level of the pulse is raised. Since an input threshold level of a C-MOS logic element depends on the power supply voltage applied thereto such that the threshold level is ½ the level of the power supply voltage. By controlling the power supply voltage, the threshold level is lowered or raised so that the pulse width is increased or decreased. Accordingly, the circuit outputs a signal having a desired pulse width.

26 Claims, 12 Drawing Sheets

FIG. 2A  A: INPUT SIGNAL (NORMAL)
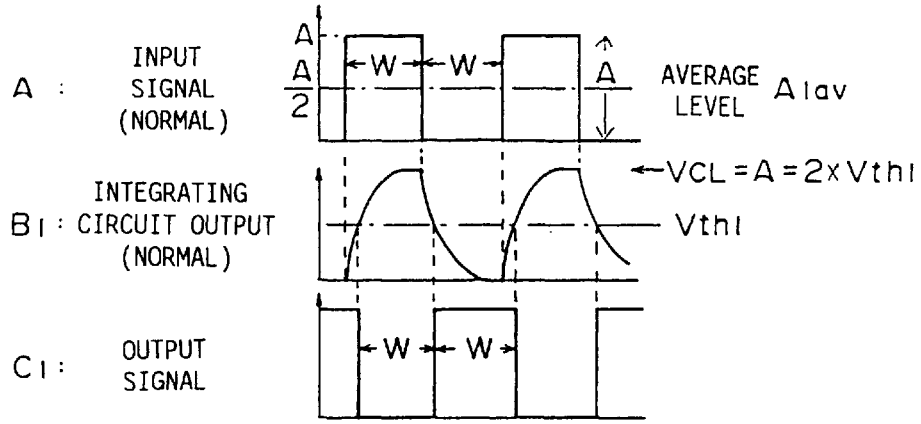
FIG. 2B  B1: INTEGRATING CIRCUIT OUTPUT (NORMAL)
FIG. 2C  C1: OUTPUT SIGNAL
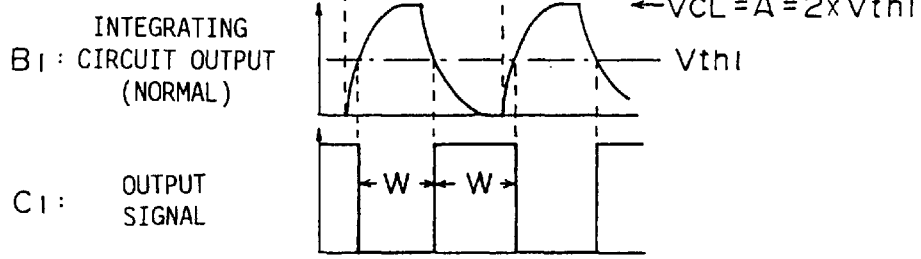
FIG. 2D  A2: INPUT SIGNAL (NARROW)
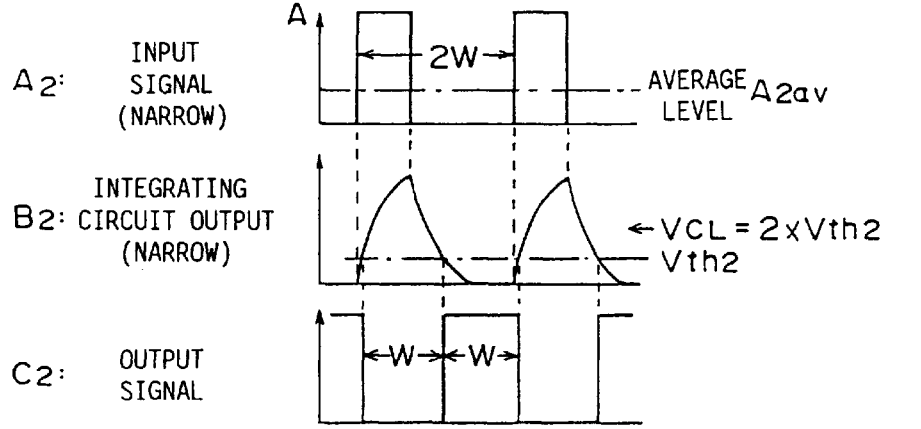
FIG. 2E  B2: INTEGRATING CIRCUIT OUTPUT (NARROW)
FIG. 2F  C2: OUTPUT SIGNAL
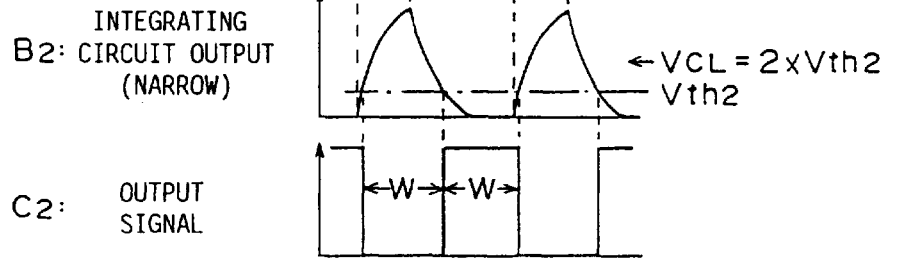
FIG. 2G  A3: INPUT SIGNAL (WIDE)
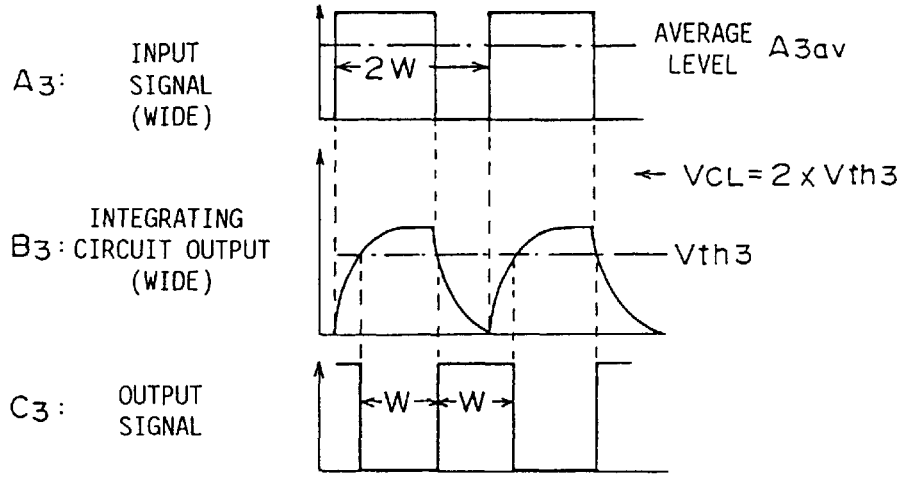
FIG. 2H  B3: INTEGRATING CIRCUIT OUTPUT (WIDE)
FIG. 2I  C3: OUTPUT SIGNAL
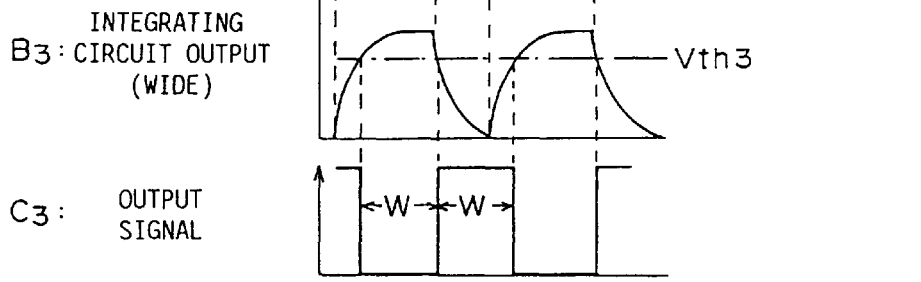

PULSE WIDTH CONTROLLING LOGIC CIRCUIT

BACKGROUND OF THE INVENTION

1. Field of the Invention

The present invention generally relates to pulse width controlling logic circuits and, more particularly, to a logic circuit for automatically controlling a width of a pulse.

2. Description of the Related Art

Japanese Laid-Open Patent Application No. 53-60550 discloses a circuit for automatically controlling a pulse width of a dial pulse. This circuit comprises a two-input comparator, an integrating circuit and a voltage averaging circuit. A dial pulse applied to an input terminal is applied to one of the two inputs of the two-input comparator via the integrating circuit. The other input of the two-input comparator is connected to an output of the voltage averaging circuit for obtaining an average of a voltage of the input pulse signal.

The integrating circuit comprises a resistor and a capacitor. Two short circuits are connected in parallel with the resistor so as to instantaneously charge and discharge the capacitor, respectively, with the input pulse signal. Each of the short circuits comprises a diode and a transistor. An output of the comparator is applied to a base of each of the transistors so as to turn the transistors on or off. With this, charging and discharging are controlled so as to obtain a desired pulse width of the input pulse signal. As a result, an input pulse signal that varies to reside outside a range of a predetermined specification is converted into a signal having a specified pulse width.

Since the circuit according to Japanese Laid-Open Patent Application No. 53-60550 requires analog circuits including the two-input comparator, the charging circuit and the discharging circuit, it has a relatively large circuit scale and is relatively expensive to manufacture as compared to a digital circuit.

SUMMARY OF THE INVENTION

Accordingly, a general object of the present invention is to provide a pulse width controlling logic circuit in which the aforementioned problems are eliminated.

Another and more specific object of the present invention is to provide a pulse width controlling logic circuit constructed of digital circuits so that the need for the two-input comparator, the charging circuit and the discharging circuit are eliminated. The circuit according to the invention is relatively compact and inexpensive to manufacture, providing the capability of reliably controlling a pulse width of an input pulse signal so that the signal has a predetermined mark-space ratio (duty ratio).

An input threshold voltage of TTL or C-MOS logic elements (for example, an inverter) is known to depend on a power supply voltage. Conventionally, the permissible fluctuation range of a power supply voltage is, for example, 4.5–6 V, making it difficult to control the power supply voltage. Recently, however, logic elements having a permissible fluctuation range of, for example, 2–10 V are available. The present invention achieves the aforementioned objective of eliminating the need for the two-input comparator by taking advantage of such logic elements. More specifically, the aforementioned objectives are achieved by using a digital circuit for controlling the pulse width and by controlling the power supply voltage of a logic element therein in which the input threshold voltage depends on the power supply voltage.

When the pulse width of the input pulse signal shifts from a normal level (for example, when the mark-space ratio varies from 50% to 40% or to 60%), the average voltage of the input pulse signal varies depending on the shift. For example, when the mark-space ratio is decreased to 40%, the average voltage is decreased, and, when the mark-space ratio is increased to 60%, the average voltage is increased. According to the invention, the input signal is converted by an integrating circuit or the like to a flat pulse having an increasingly extended pulse width as the level is decreased. The resultant signal is applied to a logic element (for example, a C-MOS inverter) in which the input threshold voltage depends on a power supply voltage. A threshold voltage is known as a level of the input voltage at which inversion of the input pulse signal occurs. For example, the threshold level of the C-MOS inverter is known to be equal to ½ of the power supply voltage. The pulse width is controlled by controlling the threshold level of the logic element to which the flat input pulse signal is applied. According to the present invention, the input threshold level is controlled by controlling the power supply voltage of the logic element in accordance with an average level of the input pulse signal. As a result, a desired pulse width is obtained.

In the case of a pulse where dc components are cut off, the magnitude of the pulse width and a positive or negative peak level of the pulse are related to each other. For this reason, the pulse width can also be controlled by using the peak level of the pulse instead of the average level thereof.

The invention provides a pulse width controlling logic circuit comprising: a pulse width controlling unit; an integrating circuit for integrating an input signal supplied thereto; an average level detecting unit for detecting an average level of the input pulse signal supplied thereto; and an average level converting unit, wherein the pulse width controlling unit is provided with a logic element in which the input threshold level depends on a power supply voltage applied to the logic element, the average level converting unit is supplied with an output signal from the average level detecting circuit and converts the output signal into a control signal, the control signal from the average level converting unit is applied to the pulse width controlling unit so as to control the power supply voltage applied to the logic element in accordance with a level of the output signal from the average level detecting unit, and the logic element converts an output signal from the integrating circuit into a pulse signal having a pulse width commensurate with the power supply voltage controlled by the pulse width controlling unit.

Since the pulse width controlling logic circuit of the invention is basically constructed as a logic circuit and operates on controlling the threshold level of the logic element, the two-input comparator, the charging circuit or the discharging circuit is not necessary. The pulse width of an input pulse signal is controlled inexpensively and reliably using a relatively small circuit. For example, when a CMI or NRZ signal pulse preferably having a mark-space ratio of 50% is distorted, the pulse width is controlled so that the 50% mark-space ratio is restored.

The present invention also provides a pulse width controlling logic circuit comprising: a pulse width controlling unit; an integrating circuit for integrating an input signal supplied thereto; an average level detecting unit supplied with an output signal from the pulse width controlling unit; and an average level converting unit, wherein the pulse width controlling unit is provided with a logic element in which the input threshold level depends on a power supply voltage applied to the logic element, the average level converting unit is supplied with an output signal from the average level detecting circuit and converts the output signal from the average level detecting circuit into a control signal, the control signal from the average level converting unit is applied to the pulse width controlling unit so as to control the power supply voltage applied to the logic element in accordance with a level of the output signal from the average level detecting unit, and the logic element converts an output signal from the integrating circuit into a pulse signal having a pulse width commensurate with the power supply voltage controlled by the pulse width controlling unit.

According to this aspect of the invention, by detecting an average level of a pulse in a last stage of the circuit of the invention, distortion occurring in the preceding stages can be corrected so that an appropriate pulse width is restored.

A low-pass filter may be provided to precede the average level detecting unit.

According to this aspect of the invention, undesirable effects derived from peaking are eliminated in detecting the average level.

The average level converting unit may be provided with an operational amplifier, an input of the operational amplifier being supplied with the output signal from the average level detecting unit and another input of the operational amplifier being connected to a reference potential, and the reference potential has a level equal to a level of the output signal from the average level detecting unit occurring when the input pulse signal is an ideal pulse.

According to this aspect of the invention, the pulse width is controlled with a high precision by adjusting a resistance that determines an amplification factor of the operation amplifier.

The average level converting unit may include an analog-to-digital converter, a digital processing circuit and a digital-to-analog converter in a cascade connection.

According to this aspect of the invention, the pulse width is controlled with a high precision and flexibility, by storing data relating to desired pulse widths in a digital processing circuit that includes a CPU.

The aforementioned objects can also be achieved by a pulse width controlling logic circuit comprising: a pulse width controlling unit; an integrating circuit for integrating an input signal supplied thereto; a capacitor; a peak level detecting unit for detecting a peak level of the input pulse signal supplied thereto via the capacitor; and a peak level converting unit, wherein the pulse width controlling unit is provided with a logic element in which the input threshold level depends on a power supply voltage applied to the logic element, the peak level converting unit is supplied with an output signal from the peak level detecting circuit and converts the output signal into a control signal, the control signal from the peak level converting unit is applied to the pulse width controlling unit so as to control the power supply voltage applied to the logic element in accordance with a level of the output signal from the peak level detecting unit, and the logic element converts an output signal from the integrating circuit into a pulse signal having a pulse width commensurate with the power supply voltage controlled by the pulse width controlling unit.

According to this aspect of the invention, the pulse width is controlled according to an alternative principle.

The aforementioned objects can also be achieved by a pulse width controlling logic circuit comprising: a pulse width controlling unit; an integrating circuit for integrating an input signal supplied thereto; a capacitor; a peak level detecting unit supplied with an output signal from the pulse width controlling unit via the capacitor; and a peak level converting unit, wherein the pulse width controlling unit is provided with a logic element in which the input threshold level depends on a power supply voltage applied to the logic element, the peak level converting unit is supplied with an output signal from the peak level detecting circuit and converts the output signal from the peak level detecting circuit into a control signal, the control signal from the peak level converting unit is applied to the pulse width controlling unit so as to control the power supply voltage applied to the logic element in accordance with a level of the output signal from the peak level detecting unit, and the logic element converts an output signal from the integrating circuit into a pulse signal having a pulse width commensurate with the power supply voltage controlled by the pulse width controlling unit.

According to this aspect of the invention, by detecting an average level of a pulse in a last stage of a transfer device in which the invention is used, distortion occurring in the preceding stages is corrected so that an appropriate pulse width is restored.

A low-pass filter may be provided to precede the capacitor.

According to this aspect of the invention, undesirable effects resulting from peaking are eliminated in detecting the average level.

The peak level converting unit may be provided with an operational amplifier, an input of the operational amplifier being supplied with the output signal from the peak level detecting unit and another input of the operational amplifier being connected to a reference potential, and the reference potential has a level equal to a level of the output signal from the peak level detecting unit occurring when the input pulse signal is an ideal pulse.

According to this aspect of the invention, the pulse width is controlled with a high precision.

The peak level converting unit may include an analog-to-digital converter, a digital processing circuit and a digital-to-analog converter in a cascade connection.

According to this aspect of the invention, the pulse width is controlled so as to be highly precise and flexible.

The pulse width controlling unit may be controlled via a circuit for limiting variation in the power supply voltage.

According to this aspect of the invention, the power supply voltage $V_{CL}$ of the logic element is controlled so as to locate it in a predetermined range. Thus, interruption of an output signal or an excessive output signal is prevented.

An amplitude of the output signal from the integrating circuit is set in accordance with an operating voltage range of the pulse width controlling unit.

According to this aspect of the invention, the power supply voltage $V_{CL}$ of the logic element is controlled so as to locate it in a predetermined range, using a simple construction. Interruption of an output signal or an excessive output signal is properly prevented.

BRIEF DESCRIPTION OF THE DRAWINGS

Other objects and further features of the present invention will be apparent from the following detailed description when read in conjunction with the accompanying drawings, in which:

FIGS. 2A–2I are waveform charts showing waveforms occurring in the circuit of FIG. 1;

DETAILED DESCRIPTION OF THE PREFERRED EMBODIMENTS

Figure 1:
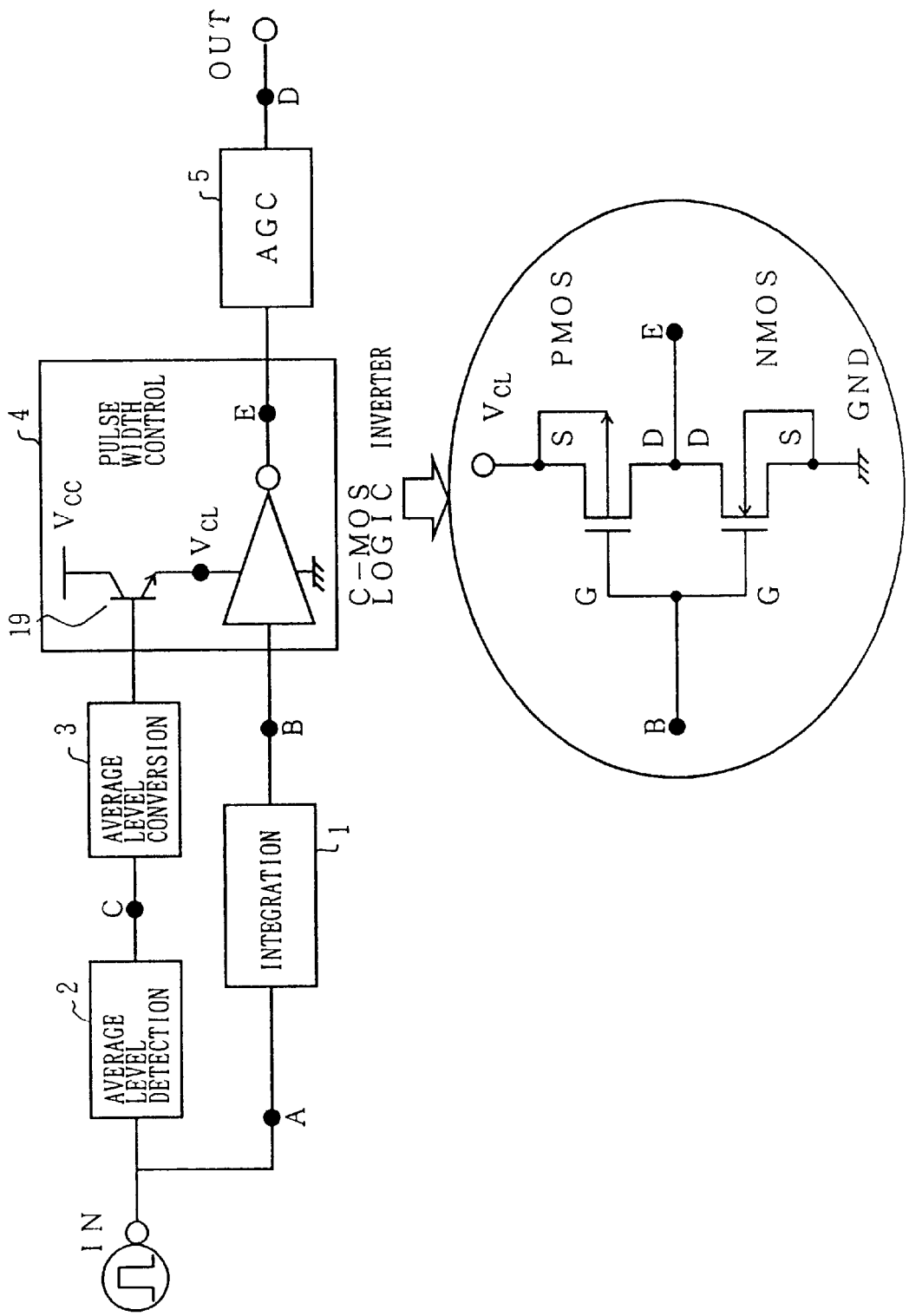
FIG. 1 shows a circuit construction according to a first embodiment of the present invention.

FIG. 1 shows a circuit construction according to a first embodiment of the present invention.

The circuit according to the first embodiment comprises an integrating circuit 1, an average level detecting unit 2, an average level converting unit 3, a pulse width controlling unit 4 and an AGC (automatic gain control) circuit 5. An input pulse signal A is applied to an input terminal IN and integrated by the integrating circuit 1. A desired output pulse signal B is obtained at an output terminal OUT via a logic element and the AGC circuit 5. The logic element is embodied by any element (for example, a TTL inverter or a C-MOS logic inverter) in which the input threshold level is known to depend on a power supply voltage. The average level detecting unit 2 detects an average level of the input pulse signal A and applies the resultant signal to the average level converting unit 3. The average level converting unit 3 converts the signal indicating the average level into a control signal for controlling the power supply voltage of the logic element to produce a desired pulse width. More specifically, the average level converting unit 3 controls a transistor 19 so as to control the power supply voltage $V_{CL}$ of the logic element (C-MOS inverter). The integrating circuit 1 is composed of, for example, a resistor and a capacitor.

FIG. 1 shows a C-MOS inverter as one example of the logic element in which the threshold level depends on a power supply voltage. When a high-level signal is applied to the node B, the P-MOS transistor cuts off and the N-MOS transistor conducts so that a low-level signal is obtained at the node E. When a low-level signal is applied to the node B, the P-MOS transistor conducts and the N-MOS transistor cuts off so that a high-level signal is obtained at the node E. Thus, the C-MOS circuit as shown functions as an inverter. A C-MOS inverter is known to have the following characteristics.

(1) The threshold level Vth at the input node B is ½ of the power supply voltage $V_{CL}$ of the C-MOS logic element.

(2) The output level (C-MOS level) is alterable between a high level which is equal to the power supply voltage $V_{CL}$ and a low level which is equal to the ground (GND) level.

FIGS. 2A–2I are waveform charts showing waveforms occurring in the circuit of FIG. 1. FIGS. 2A, 2B and 2C show a normal pulse signal A1, an associated integrated waveform B1 and an associated output signal C1 occurring at the output terminal OUT, respectively. FIGS. 2D, 2E and 2F show a narrow pulse signal A2, an associated integrated waveform B2 and an associated output signal C2, respectively. FIGS. 2G, 2H and 2I show a wide pulse signal A3, an associated integrated waveform B3 and an associated output signal C3, respectively. When the pulse width is decreased, the average level of the input pulse signal A is decreased. When the pulse width is increased, the average level is increased ($A3_{av} > A1_{av} > A2_{av}$).

It is now assumed that the normal input pulse signal A1 has an amplitude of A and the mark-space ratio thereof is such that a mark has a width of W and a space has a width of W. FIG. 2B shows the waveform of the associated integrating circuit output B1. FIG. 2C shows the waveform of the associated output signal C1. The average level detecting unit 2 determines that an average level $A1_{av}$ of the input pulse signal A is A/2. The average level converting unit 3 controls the pulse width controlling unit 4 so that the power supply voltage $V_{CL}$ of the logic element has the amplitude A of the input pulse signal. Therefore, since the input threshold level $V_{th1}$ of the C-MOS logic is ½ of the power supply voltage $V_{CL}$ of the logic element (C-MOS inverter), the input threshold level $V_{th1}$ is A/2.

It is assumed that the input pulse signal A2 having a smaller pulse width than the normal pulse signal A1 is applied to the circuit of FIG. 1. In this case, the integrating circuit output B2 is produced. The average level $A2_{av}$ of the input pulse signal A2 determined by the average level detecting unit 2 is lower than A/2, where A indicates the amplitude of the signal A2. Supplied with the output $A2_{av}$ of the average level detecting unit 2, the average level converting unit 3 controls the transistor 19 of the pulse width controlling unit 4 to decrease the power supply voltage $V_{CL}$ of the logic element to a level $2*V_{th2}$, where $V_{th2} < V_{th1}$. With this, the input threshold level of the C-MOS inverter is lowered to $V_{th2}$. Accordingly, the pulse signal C2 having the normal pulse width restored is output from the pulse width controlling unit 4.

It is assumed that the pulse A3 having a greater pulse width than the normal pulse is applied to the circuit of FIG. 1. In this case, the integrated circuit output B3 is produced. The average level $A3_{av}$ of the input pulse signal A3 determined by the average level detecting unit 2 is higher than A/2. Supplied with the output $A3_{av}$ of the average level detecting unit 2, the average level converting unit 3 controls the transistor 19 of the pulse width controlling unit 4 to increase the power supply voltage $V_{CL}$ of the logic element to a level of $2*V_{th3}$, where $V_{th3} > V_{th1}$. With this, the input threshold level of the C-MOS inverter is raised to $V_{th3}$. Accordingly, the pulse signal C3 having the normal pulse width restored is output from the pulse width controlling unit 4.

The integrating circuit 1 may be replaced by an element such as a low-pass filter characterized by a sloped waveform. That is, an element producing a greater pulse width as the signal level decreases may be used in place of the integrating circuit.

The C-MOS logic inverter may be replaced by any logic element, such as a TTL logic element in which the input threshold level depends on a power supply voltage. The logic element may not necessarily be an inverter.

Since the pulse width is controlled by controlling the power supply voltage of the C-MOS logic, it is inherent in any of the embodiments of the present invention that the amplitude of the output signal varies. However, the variation in the output signal is easily canceled by providing the AGC circuit 5 adjacent to the logic element in which the input threshold level depends on the power supply voltage. A limiter circuit for maintaining the amplitude of the input signal may be used instead of the AGC circuit 5.

Figure 3:
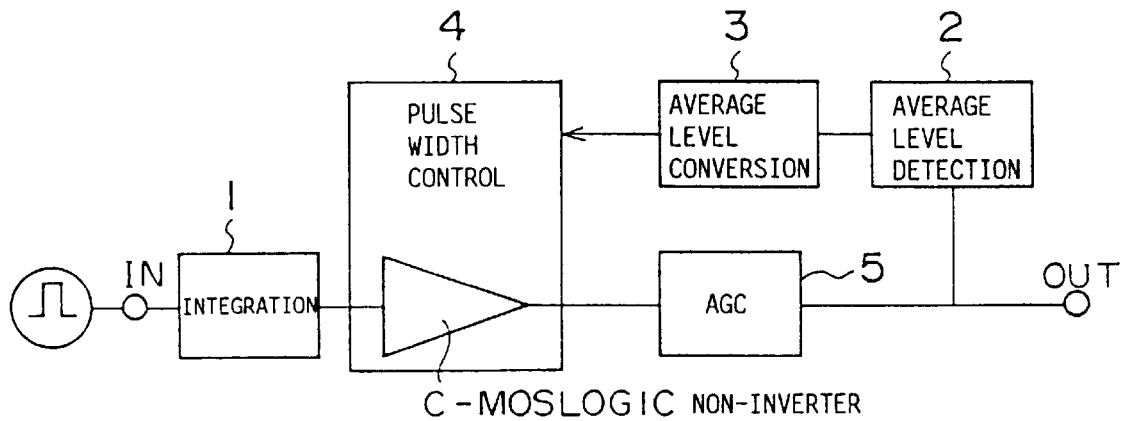
FIG. 3 shows a circuit construction according to a second embodiment of the present invention.

FIG. 3 shows a circuit construction according to a second embodiment of the present invention. The circuit of FIG. 3 comprises the integrated circuit 1, the average level detecting unit 2, the average level converting unit 3, the pulse width controlling unit 4 and the AGC circuit 5. The construction of FIG. 3 differs from the construction of FIG. 1 in that the average level detecting unit 2 is coupled to the output of the logic element instead of the input thereof. The C-MOS logic element may be a non-inverter. The only difference between an inverter and a non-inverter is that opposite control logic is used.

A description will now be given of an operation of the circuit of FIG. 3. The input pulse signal A is applied to the input terminal IN and integrated by the integrating circuit 1. A desired output pulse signal B is obtained at the output terminal OUT via the non-inverter and the AGC circuit 5. The average level detecting unit 2 detects an average level of the output of the AGC circuit 5. The average level converting unit 3 generates a control signal for controlling the power supply voltage $V_{CL}$ of the non-inverter to a level that produces a desired pulse width.

For example, when the pulse width of the input pulse signal becomes smaller than a predetermined level, the average level of the output signal of the AGC circuit 5 is decreased. The non-inverter is supplied with the output signal of the integrating circuit 1. The pulse width of the output signal of the integrating circuit 1 is decreased as the level thereof is decreased. The input threshold level of the non-inverter depends on the power supply voltage $V_{CL}$ thereof. The average level converting unit 3 lowers the power supply voltage $V_{CL}$ so as to lower the input threshold level of the non-inverter. As the input threshold level of the non-inverter is decreased, the pulse width of the output from the non-inverter is increased so that the pulse signal having a desired pulse width is output from the output terminal OUT via the AGC circuit 5.

FIG. 3 shows that the pulse width is detected at the output of the AGC circuit 5. However, the pulse width may be detected at other locations. Preferably, the pulse width is detected close to the last output stage so that the effects derived from circuit elements involved to affect the output pulse may be controlled simultaneously.

Figure 4:
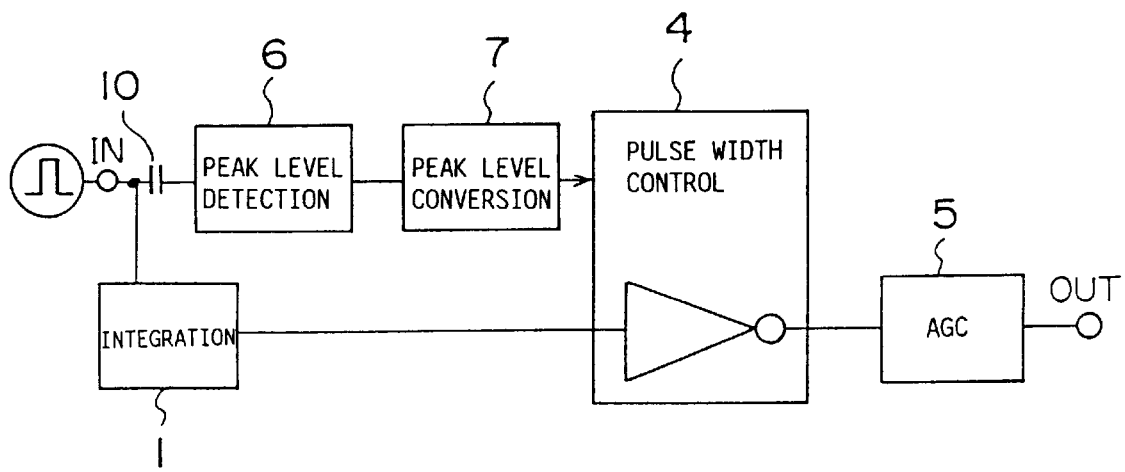
FIG. 4 shows a circuit construction according to a third embodiment of the present invention.

FIG. 4 shows a circuit construction according to a third embodiment of the present invention.

The circuit of FIG. 4 comprises the integrating circuit 1, the pulse width controlling unit 4, the AGC circuit 5, a peak level detecting unit 6, a peak level converting unit 7 and a capacitor 10. The input signal A is applied to the input IN and integrated by the integrating circuit 1. A desired output pulse signal B is obtained at the output terminal OUT via a logic element and the AGC circuit 5. The logic element is embodied by an inverter (for example, a TTL inverter or a C-MOS logic inverter) in which an input threshold level depends on a power supply voltage thereof. The peak level detecting unit 6 detects a peak level of the input pulse signal having dc components thereof cut off by the capacitor 10. The output signal from the peak level detecting unit 6 is converted by the peak level converting unit 7 into a control signal for controlling the power supply voltage $V_{CL}$ of the logic element so as to produce a desired pulse width.

Figure 5:
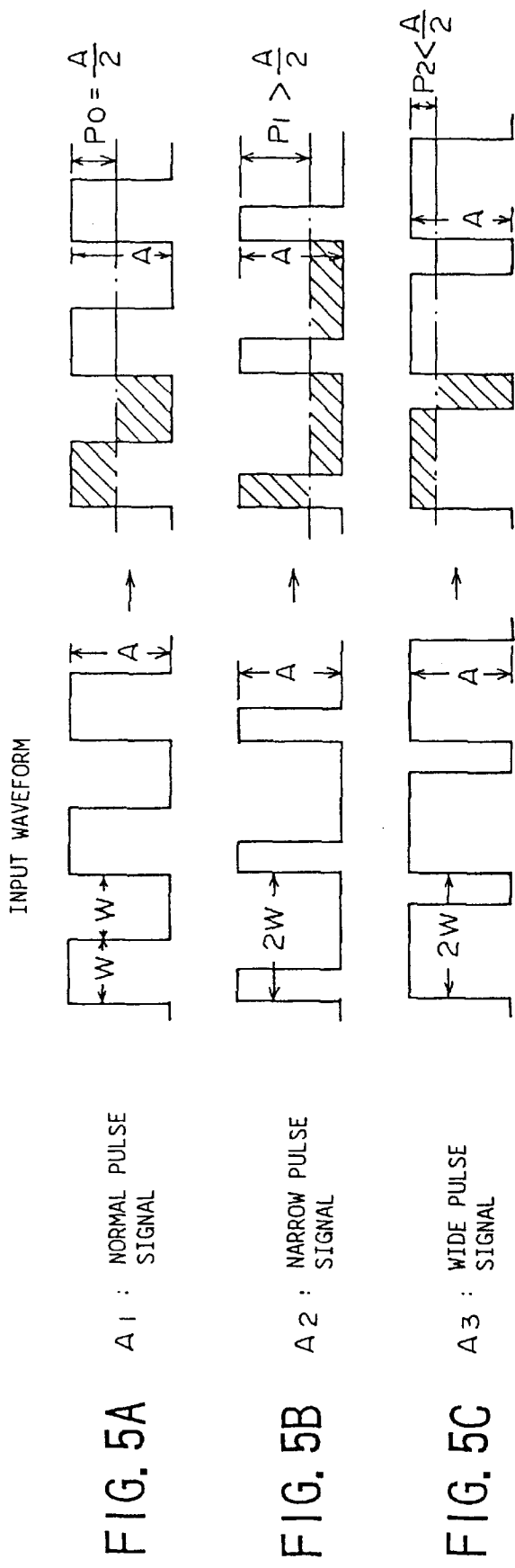
FIGS. 5A–5C show how a peak level of a pulse waveform varies as a result of a dc component cut-off.

A description will now be given, with reference to FIGS. 5A–5C, of a relation between the dc component cut-off of the input pulse signal and the peak level thereof. As shown in FIGS. 5A–5C, the dc cut-off occurs in the form of a shift of the dc components such that the positive components and the negative components balance (the area indicated by the hatching on the positive side is equal to the corresponding area on the negative side). As a result of the dc component cut-off, the positive peak level is raised as the pulse width is decreased and is lowered as the pulse width is increased. More specifically, in the case of the normal input pulse signal A1, the dc component cut-off produces a positive peak level P0 which is ½ of the amplitude A of the input pulse signal A1. The peak level P1 for the pulse signal A2 having a smaller pulse width is higher than the peak level P0, that is, higher than the level of A/2. The peak level P2 for the pulse signal A3 having a greater pulse width is lower than the peak level P0, that is, lower than the level of A/2.

Thus, it is possible to obtain a signal that corresponds to the pulse width. Similar to the constructions according to the first and second embodiments, according to the third embodiment, an inappropriate pulse width is corrected to produce a proper pulse width. The input signal of the inverter is an output signal of the integrating circuit 1. The pulse width of the output signal of the integrating circuit 1 is increased as the level thereof is lowered. The input threshold level of the non-inverter depends on the power supply voltage $V_{CL}$ thereof. The peak level converting unit 7 receives, from the peak level detecting unit 6, the positive peak level related to the pulse width. Upon receiving a relatively low positive peak level derived from the pulse signal A2 having a relatively small pulse width, the peak level converting unit 7 lowers the power supply voltage $V_{CL}$ for operating the logic element so as to lower the threshold level of the logic element. With this, the pulse width of the output signal is increased. Upon receiving a relatively low positive peak level derived from the pulse signal A3 having a relatively great pulse width, the peak level converting unit 7 raises the power supply voltage $V_{CL}$ for operating the logic element so as to raise the threshold level of the logic element. With this, the pulse width of the output signal is decreased. In this way, irrespective of the pulse width of the input pulse signal, a pulse signal having a desired pulse width is obtained at the output. The peak detection unit 7 may detect a negative bottom level which is also related to the pulse width. In this case, the power supply voltage is similarly so that the desired pulse width is obtained.

Figure 6:
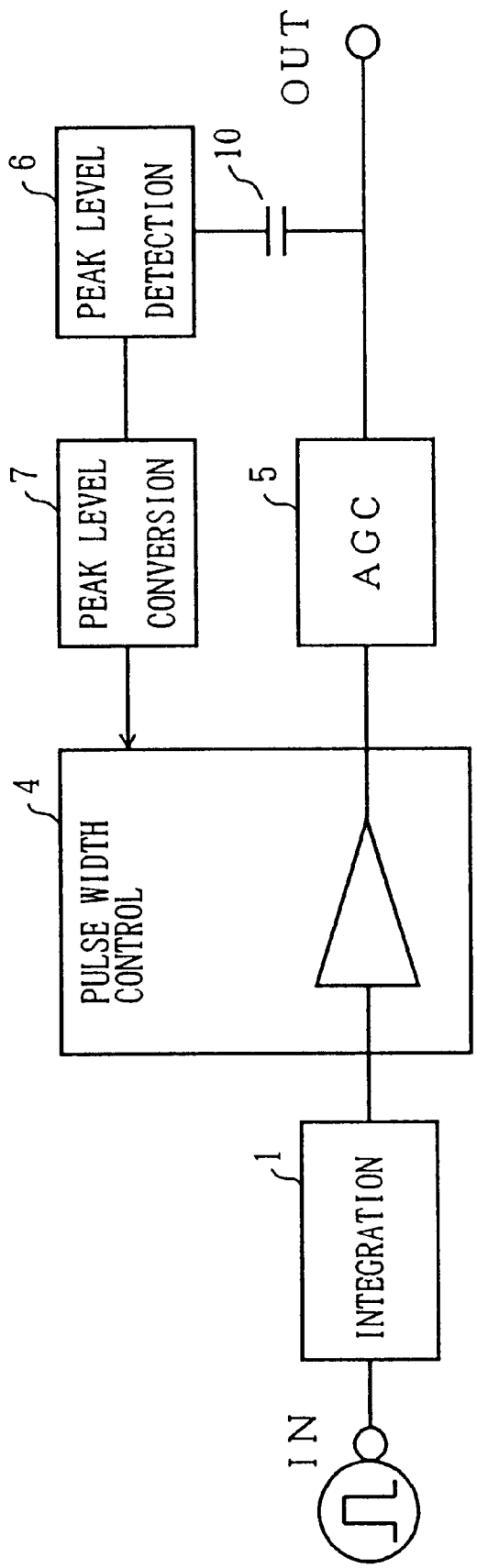
FIG. 6 shows a circuit construction according to a fourth embodiment of the present invention.

FIG. 6 shows a circuit construction according to a fourth embodiment of the present invention.

The circuit of FIG. 6 comprises the integrating circuit 1, the pulse width controlling unit 4, the AGC circuit 5, the peak level detecting unit 6, the peak level converting unit 7 and a capacitor 10. The circuit of FIG. 6 differs from the circuit of FIG. 4 in that the peak level converting unit 6 is coupled to the output, instead of the input, of the logic element in which the input threshold level depends on a power supply voltage. In FIG. 6, the logic element is embodied by a C-MOS logic non-inverter. However, the logic element may be a TTL non-inverter.

The input pulse signal A is applied to the input terminal IN and integrated by the integrating circuit 1. A desired output pulse signal B is obtained via the non-inverter and the AGC circuit 5. The peak level detecting unit 6 detects a peak level of the output signal of the AGC circuit 5 having dc components thereof cut off by the capacitor 10. The output signal of the peak level converting unit 6 is supplied to the peak level converting unit 7. The peak level converting unit 7 controls the power supply voltage for the logic element embodied by the non-inverter so as to obtain a pulse signal having a desired pulse width at the output terminal OUT.

Similar to the peak level converting unit 7 of FIG. 4, the peak level converting unit 7 of FIG. 6 receives the positive peak level from the peak level detecting unit 6. Upon receiving a relatively high peak level derived from the input pulse signal A2 having a small pulse width, the peak level converting unit 7 lowers the power supply voltage $V_{CL}$ for operating the logic element. Upon receiving a relatively low peak level derived from the input pulse signal A3 having a great pulse width, the peak level converting unit 7 raises the power supply voltage $V_{CL}$ for operating the logic element. As a result, a pulse signal having a desired pulse width is obtained at the output terminal OUT.

The average level or the peak level may not be detected properly when the waveform of the input pulse signal is deformed due to an incidence of peaking such as an overshoot or an undershoot. A low-pass filter (LPF) for eliminating peaking may be provided to precede the average detecting unit or the peak level detecting unit so as to enable the average level or the peak level to be properly detected.

Figure 7:
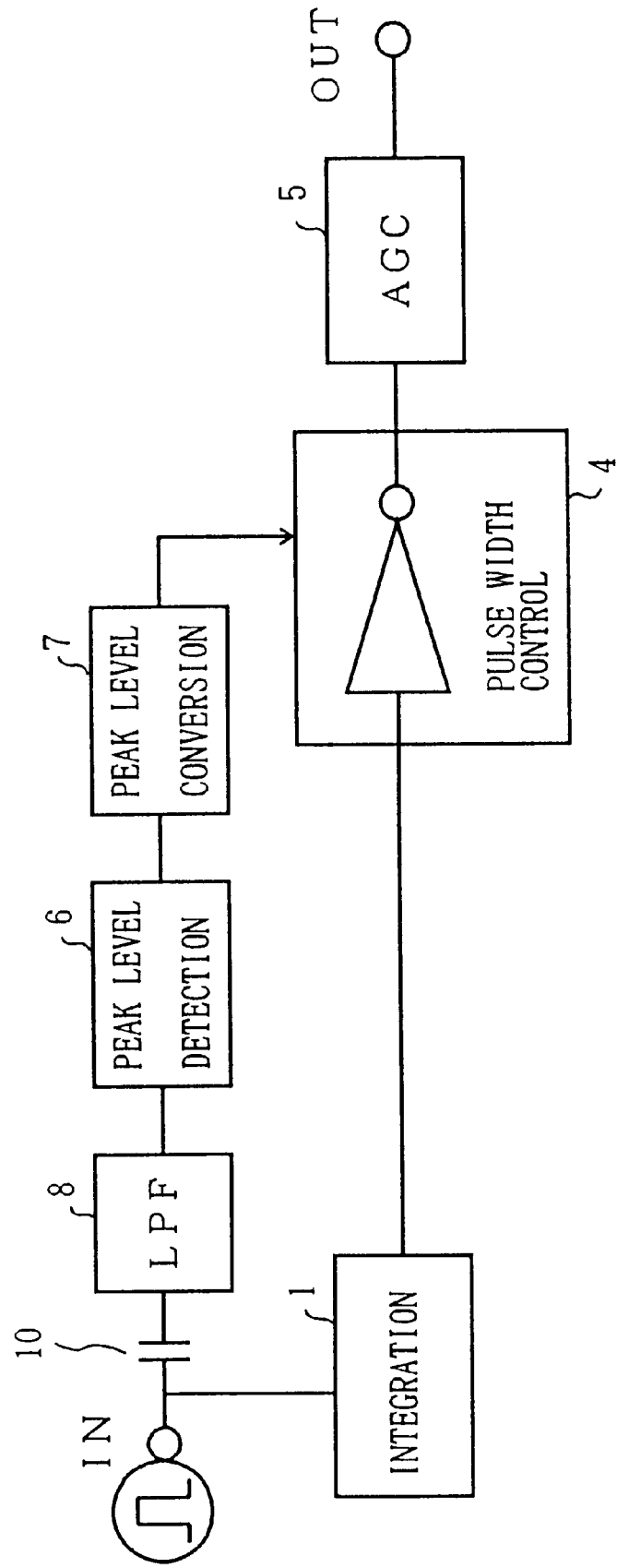
FIG. 7 shows a circuit construction according to a fifth embodiment of the present invention.

FIG. 7 shows a circuit construction according to a fifth embodiment of the present invention. The arrangement described above of introducing a low-pass filter is applied herein to a construction which includes a peak level detecting unit.

The circuit of FIG. 7 comprises the pulse width controlling unit 4, the AGC circuit 5, the peak level detecting unit 6, the peak level converting unit 7, the capacitor 10 and the low-pass filter 8. The input signal A is applied to the input terminal IN and integrated by the integrating circuit 1. A desired output pulse signal is obtained at the output terminal OUT via a logic element and the AGC circuit 5. The logic element may be embodied by a TTL inverter or a C-MOS logic inverter. The peak level detecting unit 6 detects a peak level of a the input pulse signal having dc components thereof cut off by the capacitor 10. The output signal of the peak level detecting unit 6 is converted by the peak level converting unit 7 into a control signal for controlling the power supply voltage $V_{CL}$ for operating the logic element, so that a desired pulse width is obtained.

Since the capacitor 10 only shifts the dc potential and does not substantially affect the waveform, the low-pass filter 8 may be coupled between the input terminal IN and the capacitor 10 or between the capacitor 10 and the peak level detecting unit 6 to provide the same effect.

Figure 8:
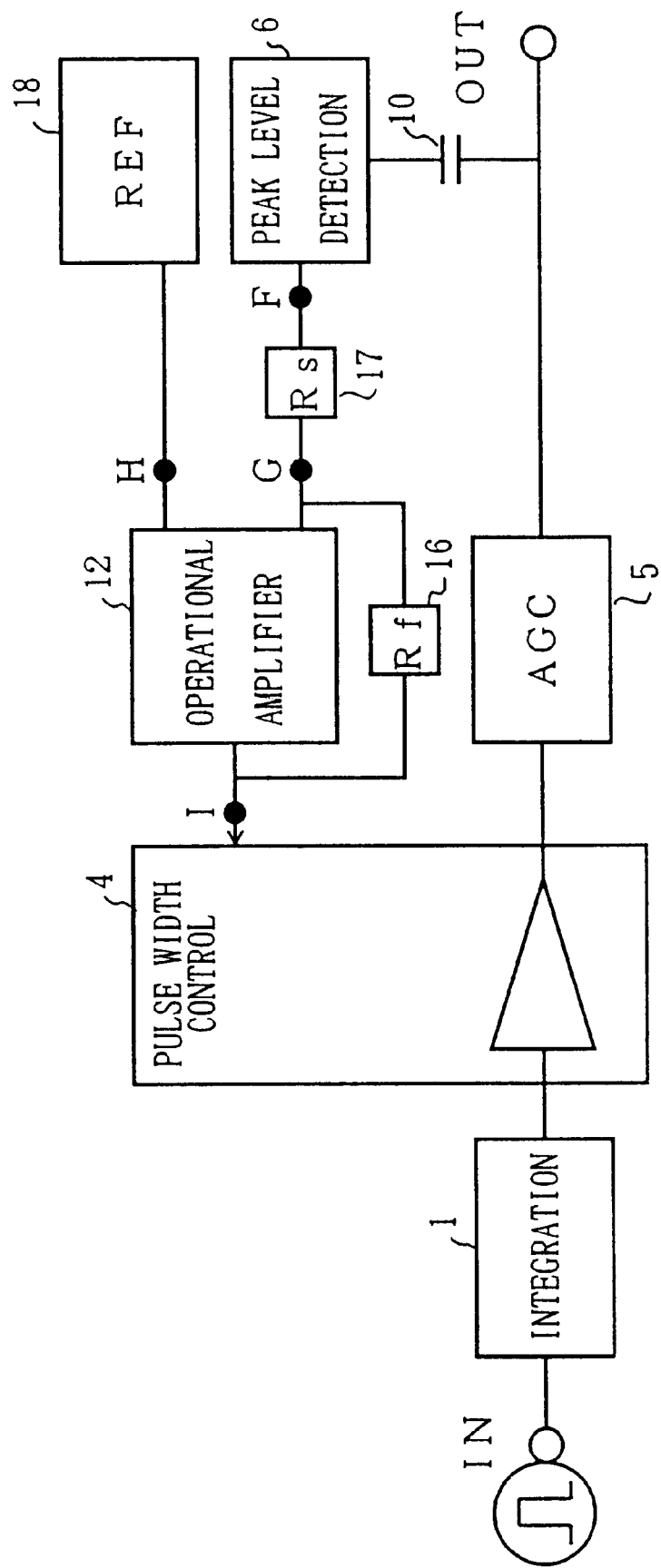
FIG. 8 shows a circuit construction according to a sixth embodiment of the present invention.

FIG. 8 shows a circuit construction according to a sixth embodiment of the present invention related to the average level converting unit and the peak level converting unit. In the circuit of FIG. 8, the peak level converting unit 7 is embodied by an operation amplifier 12. The output of the peak detecting unit 6 is applied to the inverting input of the operation amplifier 12, and a reference potential is connected to the non-inverting input of the operational amplifier 12. The reference potential is equal to the output level of the peak detecting unit 6 occurring when the input pulse is an ideal pulse.

While FIG. 8 shows a construction adapted for the peak level converting unit, the same approach may also be adapted to the average level converting unit.

The operational amplifier 12 may have the following characteristic;

$$V_i = V_{ref} + (V_{ref} - V_{peak}) \cdot Rf/Rs \qquad (1)$$

where $V_{ref}$ indicates a potential at the node H, $V_{peak}$ indicates a potential at the node F, $V_i$ indicates a potential at the node I, and Rf and Rs are parameters that determine the amplification performance of the operational amplifier.

Assuming that the input pulse signal has an ideal pulse width, the output potential $V_i$ of the operational amplifier 12 is equal to the potential $V_{ref}$. When the input pulse signal does not have an ideal pulse width, the power supply voltage $V_{CL}$ is controlled appropriately in accordance with equation (1). By choosing the parameters Rf and Rs appropriately, high-precision control is possible.

Figure 9:
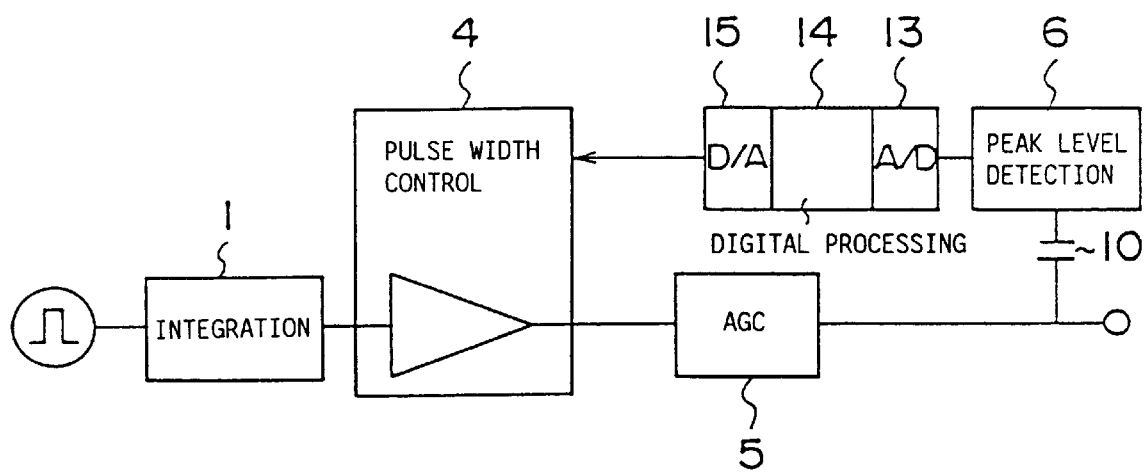
FIG. 9 shows a circuit construction according to a seventh embodiment of the present invention.

FIG. 9 shows a circuit construction according to a seventh embodiment of the present invention. The peak level converting unit is implemented by using a digital processing circuit that includes a CPU in order to effect high-precision control of the power supply voltage $V_{CL}$. The peak level converting unit according to the seventh embodiment comprises an analog-to-digital converter 13, a digital processing circuit 14 that includes a CPU and a digital-to-analog converter 15 coupled to each other. The output of the peak level detecting unit 6 is applied to the digital processing circuit 14 via the analog-to-digital converter 13. The digital processing circuit 14 generates a digital signal indicating a potential level for controlling the power supply voltage $V_{CL}$ by referring to a table stored in a memory coupled to the CPU included in the digital processing circuit 14. The resultant potential level is output to the digital-to-analog converter 15 where the digital signal is converter into an analog signal for controlling the power supply voltage $V_{CL}$. As a result, a pulse signal having a desired pulse width is output from the output terminal OUT.

While the construction of FIG. 9 is adapted for the peak level conversion, the same arrangement may also be applied to the average level detection.

The memory in the digital processing circuit 14 stores, in the form of a table or an equation, control data for different peak levels for controlling the pulse width to a desired level. Upon receiving the digital signal indicating the peak level from the peak level detecting unit 6 via the analog-to-digital converter 13, the digital processing circuit 14 outputs the associated control data to the digital-to-analog converter 15. The digital-to-analog converter 15 converts the control data to an analog signal for controlling the power supply voltage $V_{CL}$. The result is that a pulse signal having a desired pulse width is obtained at the output terminal OUT.

Since the pulse width is digitally controlled by the digital processing circuit 14, an offset error or a variation occurring in an analog operation is absent so that high-precision pulse width control is possible. Since arbitrary pulse width control data can be written in the memory, the following advantages are provided:

(1) A program may be introduced for controlling the power supply voltage $V_{CL}$ of the C-MOS logic to reside within a predetermined range.

(2) The pulse width controlling circuit may be used in combination with a temperature sensor so that the pulse width is increased in a high-temperature condition and decreased in a low-temperature condition.

Accordingly, flexibility in controlling the power supply voltage $V_{CL}$ is improved and the adaptability of the circuit design is facilitated.

A description will now be given of a construction in which a $V_{CL}$-limiter for preventing the power supply voltage $V_{CL}$ for the logic element from residing outside an operating range is introduced. It is to be noted that, according to the arrangement of the present invention described so far, it is possible for the power supply voltage $V_{CL}$ for the logic element to exceed the operating range or to fail to reach the operating range when the pulse width of the input pulse signal varies to a significant degree. When this occurs, interruption of the output signal or an excessive output signal results. In order to prevent this, a $V_{CL}$-limiter for controlling the power supply voltage not to reside outside the operating range may be provided. In the event that the power supply voltage $V_{CL}$ for the logic element is likely to reside outside the operating range, a control voltage equal to an extreme level within the operating range is used to control the logic element so as to replace the control signal that normally controls the logic element.

Figure 10:
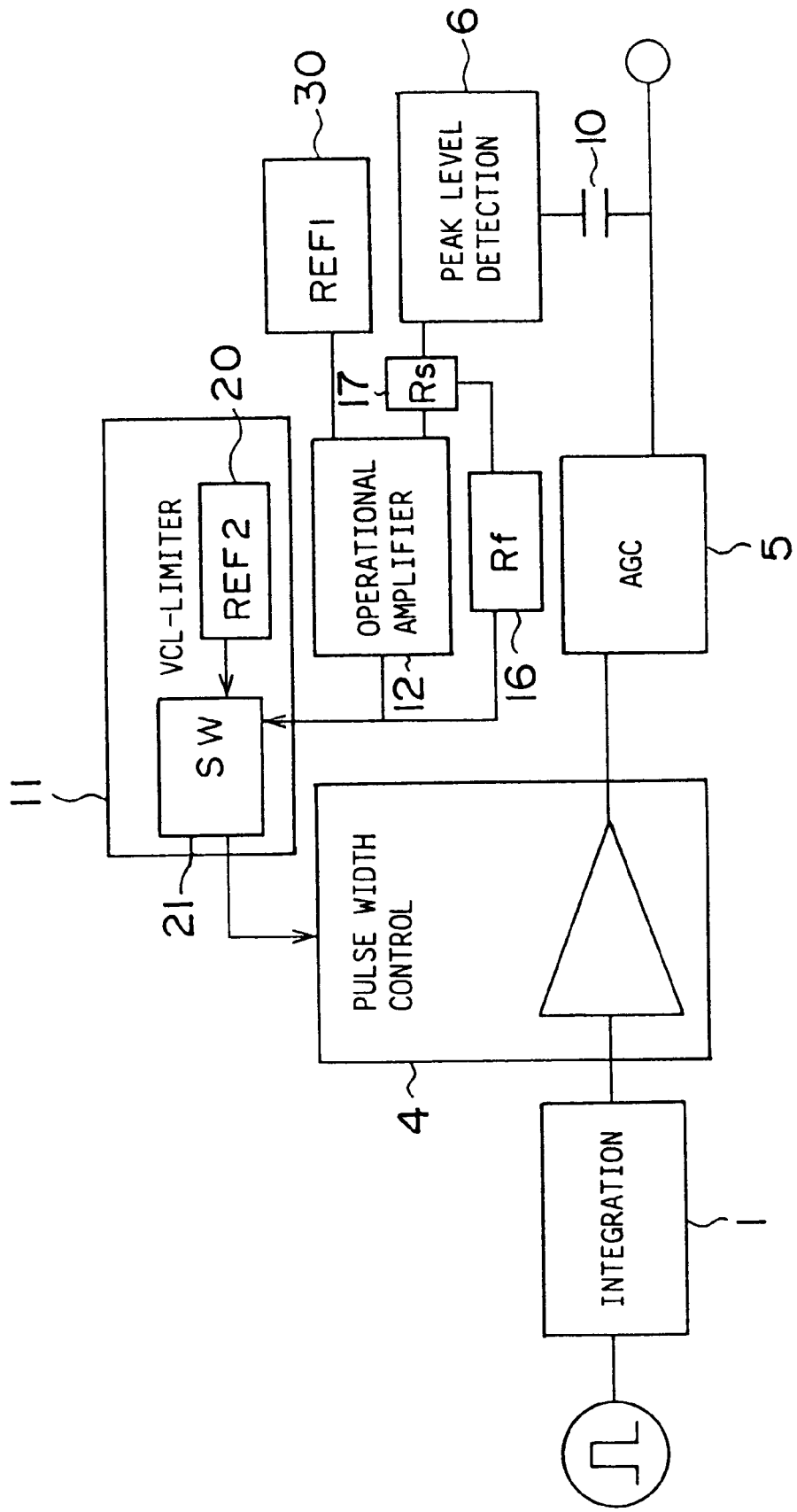
FIG. 10 shows a circuit construction according to an eighth embodiment of the present invention.

FIG. 10 shows a circuit construction according to an eighth embodiment of the present invention. Referring to FIG. 10, when the pulse width of the input pulse signal is decreased, the power supply voltage $V_{CL}$ of the logic element is controlled by the output of the operational amplifier 12 so as to become lower. In the event that the decrease is excessive so that the power supply voltage $V_{CL}$ is about to drop lower than a lower extreme level $V_{CL}(MIN)$ of the operating range, the switch SW of the $V_{CL}$-limiter is activated to connect the output of the operational amplifier 12 to a reference potential REF2. By setting the reference potential REF2 at the level of $V_{CL}(MIN)$, the power supply voltage $V_{CL}$ does not become lower than the lower extreme of the operating range. Thus, interruption of the output signal is prevented. When the pulse width of the input pulse signal is increased, the power supply voltage $V_{CL}$ of the logic element is controlled by the output of the operational amplifier 12 so as to become higher. In the event that the increase is excessive so that the power supply voltage $V_{CL}$ is about to exceed an upper extreme level $V_{CL}(MAX)$ of the operating range, the switch SW of the $V_{CL}$-limiter is activated to connect the output of the operational amplifier 12 to a reference potential REF2. By setting the reference potential REF2 at the level of $V_{CL}(MAX)$, the power supply voltage $V_{CL}$ does not become higher than the upper extreme of the operating range. Thus, an excessive output signal is prevented.

By setting the reference potential REF2 at a level other than a level at the extreme of the operating range of the power supply voltage $V_{CL}$, other objectives may be served. For example, a circuit succeeding the pulse width controlling circuit may require that a certain level of current be output from the C-MOS logic element, thus requiring that the power supply voltage $V_{CL}$ be higher than a predetermined level. Alternatively, the power supply voltage $V_{CL}$ of the logic element may preferably be higher than a predetermined level due the requirement for a high-speed operation. In such cases, the power supply voltage $V_{CL}$ is prevented from dropping below a predetermined level within the operating range by switching the output of, for example, the operational amplifier 12 to a reference potential level when the control signal output therefrom is about to drop below a predetermined level.

While FIG. 10 shows an example where the peak level converting unit is embodied by the operational amplifier 12, the eighth embodiment described above may also be applied to the constructions shown in FIGS. 1 and 9.

The foregoing description assumes that only one reference potential (REF2) is used. However, the $V_{CL}$-limiter may also be provided for both an upper extreme and a lower extreme of the operating range of the power supply voltage.

Figure 11:
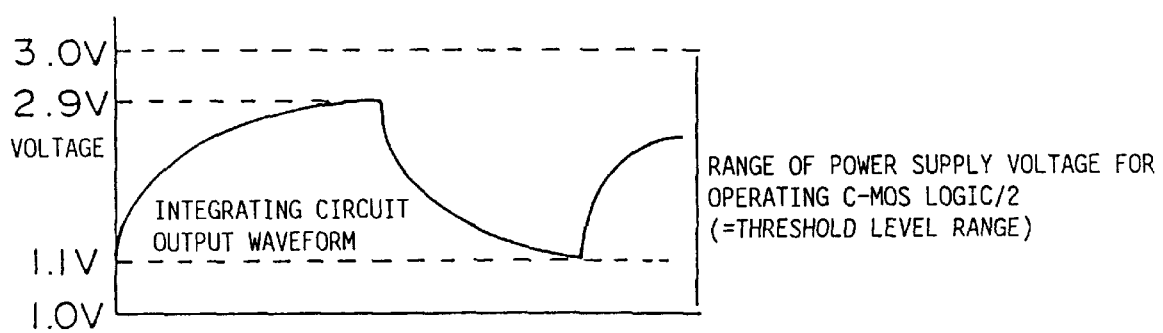
FIG. 11 shows a relation between a waveform of an output of the integrating circuit and an input threshold level of a logic element.

A description will now be given of how a signal level of the integrating circuit 1 is controlled not to be outside a range commensurate with the operating range of the power supply voltage $V_{CL}$ of the logic element. FIG. 11 shows a relation between the waveform of the output of the integrating circuit 1 and the input threshold level of the logic element. The output level of the integrating circuit 1 is controlled to reside within a range that is ½ in extent of the operating range of the power supply voltage $V_{CL}$ of the logic element provided in the succeeding pulse width controlling unit.

When the pulse width of the input pulse signal varies to an excessive degree, the input to the logic element may exceed an upper extreme of the operating range of the power supply voltage $V_{CL}$ of the logic element or fail to reach a lower extreme of the operating range, resulting in an excessive output signal or interruption in the output signal, respectively. The arrangement illustrated in FIG. 11 is intended to prevent such a condition from occurring by controlling the level of the input to the logic element to reside within a range that is ½ in extent of the operating range of the power supply voltage $V_{CL}$.

For example, when the operating range of the C-MOS logic element for controlling the pulse width is 2.0 V–6.0 V, the output signal level of the preceding integrating circuit 1 may be controlled so as to be alterable between a high level of 2.9 V and a low level of 1.1 V. With this setting, irrespective of a variation in the pulse width of the input pulse signal, it is ensured that the input to the C-MOS logic element resides in the range that is ½ in extent of the operating range of the power supply voltage $V_{CL}$ of the C-MOS logic element. Accordingly, the power supply voltage $_{CL}$ of the logic element is prevented from residing outside the operating range.

Figure 12:
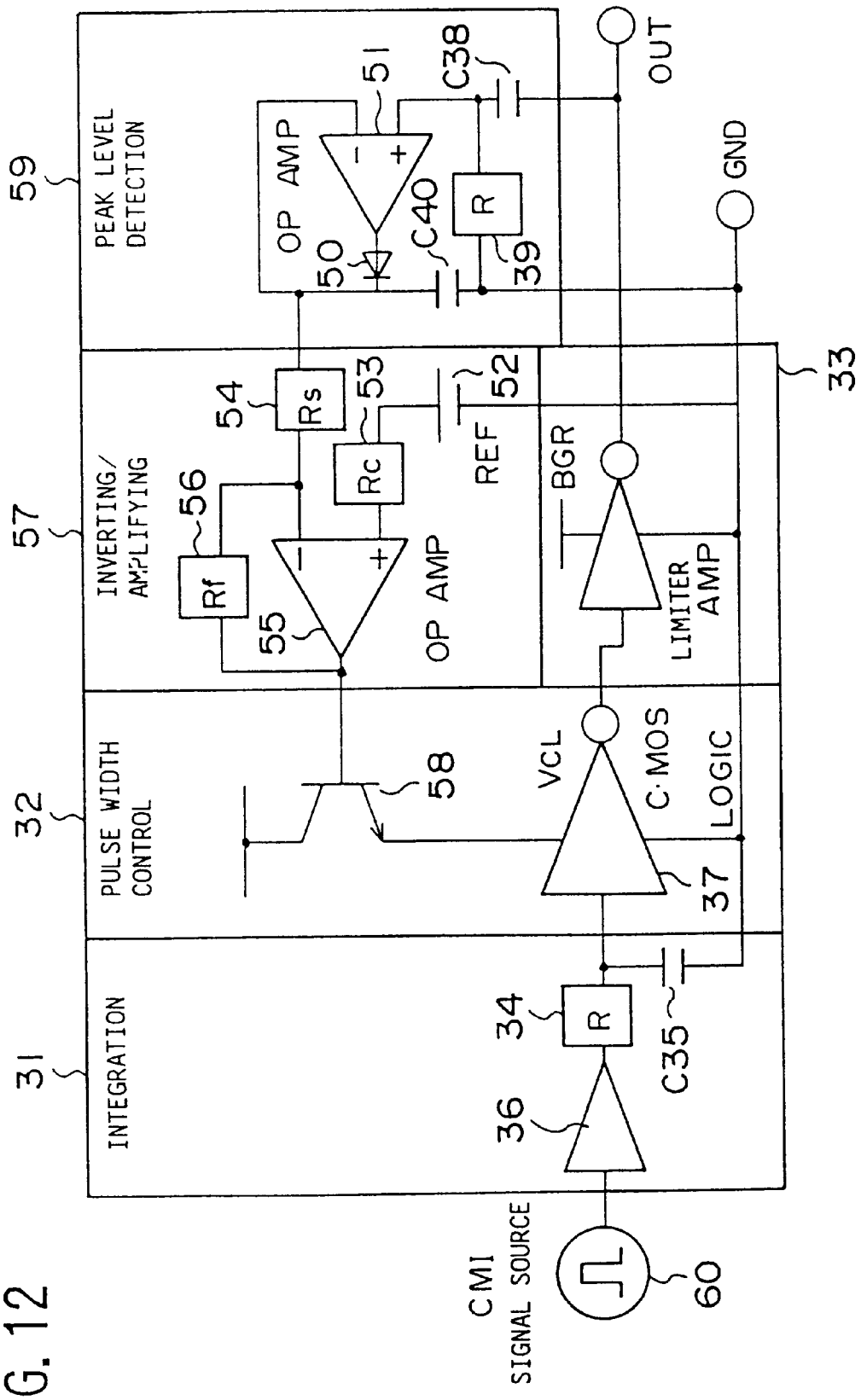
FIG. 12 shows a circuit construction that implements the principle illustrated in FIG. 11.

FIG. 12 shows a circuit construction that implements the principle illustrated in FIG. 11. The circuit of FIG. 12 comprises a CMI signal source 60, an integrating circuit 31, a pulse width controlling unit 32, a limiter amplifier 33, a peak level detecting circuit 59 and an inverting amplifier 57. The integrating circuit 31 includes a non-inverter 36, a resistor 34 and a capacitor 35. The pulse width controlling unit 32 includes a transistor 58 and a C-MOS logic element 37. The inverting amplifier 57 includes a reference power supply REF 52, an operational amplifier 55 controlled by a parameter Rc 53, a parameter Rs 54 and a parameter Rf 56. The peak level detecting unit 59 includes an operational amplifier 51, a diode 50, a capacitor 38, a resistor 39 and a capacitor 40. The limiter amplifier 33 provides a limiter circuit and the peak level detecting circuit 59 provides a peak level holding circuit.

Figure 13:
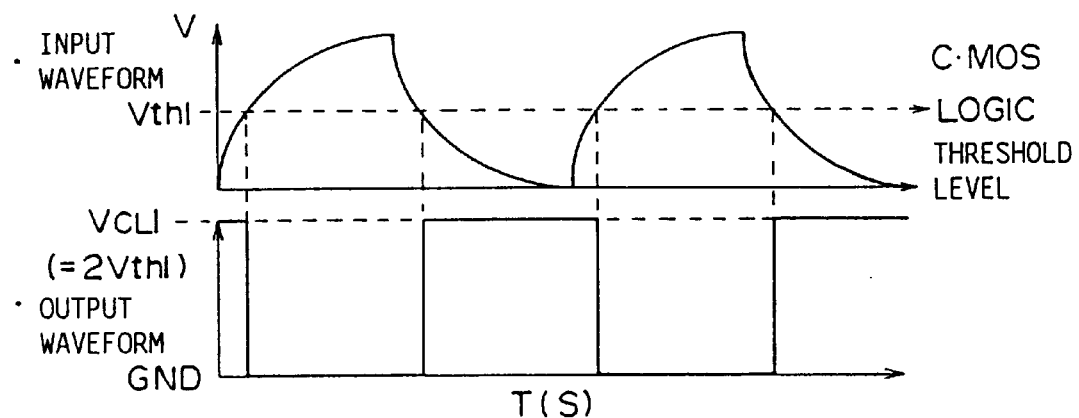
FIG. 13 shows a waveform of an input signal fed to a pulse width controlling unit when a normal signal is output from a CMI signal source, and also showing an associated output signal from the pulse width controlling unit.

FIG. 13 shows a waveform of an input signal fed to the pulse width controlling unit 32 when a normal signal having a mark-space ratio (duty ratio) of 50% is output from the CMI signal source 60, and also showing an associated output signal from the pulse width controlling unit 32. Referring to FIG. 13, $V_{th1}$ indicates a normal input threshold level of the C-MOS logic element 37 provided in the pulse width controlling unit 32. Since the input threshold level $V_{th1}$ is ½ the level of the power supply voltage $V_{CL}$ of the C-MOS logic element, the limiter amplifier 33, the peak level detecting unit 59 and the inverting amplifier 57 effect a feedback control so that the power supply voltage $V_{CL}$ is maintained at the level of $2 \cdot V_{th1}$. Thus, the mark-space ratio of the pulse signal output from the pulse width controlling unit 32 is controlled to be 50% as indicated by the waveform at the bottom of FIG. 13.

Figure 14:
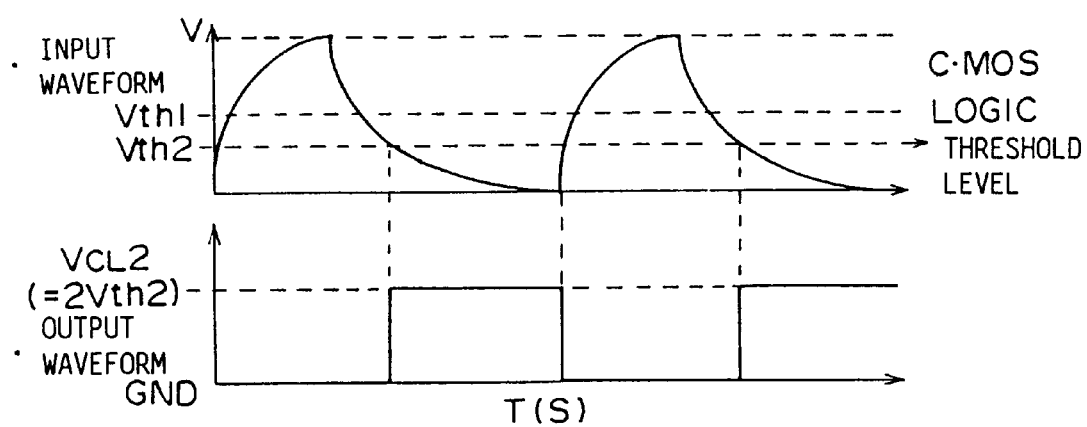
FIG. 14 shows how a pulse width of an input pulse signal degraded with time is corrected.

When the mark-space ratio of the signal output from the CMI signal source 60 drops to 40% with time, as shown in FIG. 14, the peak level of the capacity coupling output from a first stage of the peak level detecting unit 59 is increased so that the output potential of the peak level detecting unit 59 is increased. Associated with this, the output voltage of the inverting amplifier 57 drops in such a manner as to form a virtual short circuit with respect to the power supply REF 52. Thus, the power supply voltage $V_{CL}$ of the C-MOS logic element provided in the pulse width controlling unit 32 is lowered. Accordingly, the input threshold level of the C-MOS logic element is lowered so that the pulse width of the output signal from the pulse width controlling unit 32 is increased. The amplitude of the output signal of the pulse width controlling unit 32 varies due to a variation in the power supply voltage $V_{CL}$. However, the amplitude of the output signal of the pulse width controlling unit 32 is controlled by the limiter amplifier 33 to remain at a constant level.

The increase in the pulse width of the output signal from the pulse width controlling unit 32 settles to a level such that the mark-space ratio thereof is 50% because the power supply REF 52 of the inverting amplifier 57 is set to a such a level as to cause the mark-space ratio of the output signal of the pulse width controlling unit 32 to be maintained at 50%. FIG. 14 shows how the power supply voltage $V_{CL}$ and the threshold level $V_{th2}$ are decreased so as to maintain the mark-space ratio of the output signal of the pulse width controlling unit 32 at 50%, in response to a decrease in the pulse width of the input pulse signal of the pulse width controlling unit 32.

The present invention may be suitably used in a signal transfer apparatus or an information processing apparatus which deals with a signal having a predetermined target mark-space ratio (for example, a CMI signal and a NRZ signal having a target mark-space ratio of 50%). By controlling a voltage applied to a logic element having an input threshold level which depends on a power supply voltage thereof, the pulse width of the input pulse signal is controlled so that a pulse signal having a specific mark-space ratio is obtained.

It will also be appreciated that the present invention is capable of suppressing a variation in the performance of the aforementioned apparatus due to a degradation with time or due to a variation in the temperature or the power supply voltage at a low cost.

The present invention provides conversion of a pulse width of an input pulse signal into a desired level without using analog components such as a two-input comparator, a charging circuit and a discharging circuit at a low cost and in a reliable manner, using a relatively small scale circuit.

The present invention is not limited to the above described embodiments, and variations and modifications may be made without departing from the scope of the present invention.

What is claimed is:

1. A pulse width controlling logic circuit comprising:
   a pulse width controlling unit;
   an integrating circuit for integrating an input signal supplied thereto;
   an average level detecting unit for detecting an average level of the input pulse signal supplied thereto; and
   an average level converting unit,
   wherein
      said pulse width controlling unit is provided with a logic element having an input threshold level that depends on a power supply voltage applied to the logic element,
      said average level converting unit is supplied with an output signal from said average level detecting circuit and converts the output signal into a control signal,
      the control signal from said average level converting unit is applied to said pulse width controlling unit so as to control the power supply voltage applied to the logic element in accordance with a level of the output signal from said average level detecting unit, and
      the logic element converts an output signal from said integrating circuit into a pulse signal having a pulse width commensurate with the power supply voltage controlled by said pulse width controlling unit.

2. The pulse width controlling logic circuit as claimed in claim 1, wherein a low-pass filter is provided to precede said average level detecting unit.

3. The pulse width controlling logic circuit as claimed in claim 1, wherein said average level converting unit is provided with an operational amplifier, an input of said operational amplifier being supplied with the output signal from said average level detecting unit and another input of said operational amplifier being connected to a reference potential, and
   said reference potential has a level equal to a level of the output signal from said average level detecting unit occurring when the input pulse signal is an ideal pulse.

4. The pulse width controlling logic circuit as claimed in claim 1, wherein said average level converting unit includes an analog-to-digital converter, a digital processing circuit and a digital-to-analog converter in a cascade connection.

5. The pulse width controlling logic circuit as claimed in claim 1, wherein said pulse width controlling unit is controlled via a circuit for limiting variation in the power supply voltage.

6. The pulse width controlling logic circuit as claimed in claim 1, wherein an amplitude of the output signal from said integrating circuit is set in accordance with an operating voltage range of said pulse width controlling unit.

7. A pulse width controlling logic circuit comprising:
   a pulse width controlling unit;
   an integrating circuit for integrating an input signal supplied thereto;
   an average level detecting unit supplied with an output signal from said pulse width controlling unit; and
   an average level converting unit,
   wherein
      said pulse width controlling unit is provided with a logic element having an input threshold level that depends on a power supply voltage applied to the logic element,
      said average level converting unit is supplied with an output signal from said average level detecting circuit and converts the output signal from said average level detecting circuit into a control signal,
      the control signal from said average level converting unit is applied to said pulse width controlling unit so as to control the power supply voltage applied to the logic element in accordance with a level of the output signal from said average level detecting unit, and
      the logic element converts an output signal from said integrating circuit into a pulse signal having a pulse width commensurate with the power supply voltage controlled by said pulse width controlling unit.

8. The pulse width controlling logic circuit as claimed in claim 7, wherein a low-pass filter is provided to precede said average level detecting unit.

9. The pulse width controlling logic circuit as claimed in claim 7, wherein said average level converting unit is provided with an operational amplifier, an input of said operational amplifier being supplied with the output signal from said average level detecting unit and another input of said operational amplifier being connected to a reference potential, and said reference potential has a level equal to a level of the output signal from said average level detecting unit occurring when the input pulse signal is an ideal pulse.

10. The pulse width controlling logic circuit as claimed in claim 7, wherein said average level converting unit includes an analog-to-digital converter, a digital processing circuit and a digital-to-analog converter in a cascade connection.

11. The pulse width controlling logic circuit as claimed in claim 7, wherein said pulse width controlling unit is controlled via a circuit for limiting variation in the power supply voltage.

12. The pulse width controlling logic circuit as claimed in claim 7, wherein an amplitude of the output signal from said integrating circuit is set in accordance with an operating voltage range of said pulse width controlling unit.

13. A pulse width controlling logic circuit comprising:
a pulse width controlling unit;
an integrating circuit for integrating an input signal supplied thereto;
a capacitor;
a peak level detecting unit for detecting a peak level of the input pulse signal supplied thereto via said capacitor; and
a peak level converting unit,
wherein
said pulse width controlling unit is provided with a logic element having an input threshold level that depends on a power supply voltage applied to the logic element,
said peak level converting unit is supplied with an output signal from said peak level detecting circuit and converts the output signal into a control signal,
the control signal from said peak level converting unit is applied to said pulse width controlling unit so as to control the power supply voltage applied to the logic element in accordance with a level of the output signal from said peak level detecting unit, and
the logic element converts an output signal from said integrating circuit into a pulse signal having a pulse width commensurate with the power supply voltage controlled by said pulse width controlling unit.

14. The pulse width controlling logic circuit as claimed in claim 13, wherein a low-pass filter is provided to precede said capacitor.

15. The pulse width controlling logic circuit as claimed in claim 13, wherein a low-pass filter is provided to follow said capacitor.

16. The pulse width controlling logic circuit as claimed in claim 13, wherein said peak level converting unit is provided with an operational amplifier, an input of said operational amplifier being supplied with the output signal from said peak level detecting unit and another input of said operational amplifier being connected to a reference potential, and said reference potential has a level equal to a level of the output signal from said peak level detecting unit occurring when the input pulse signal is an ideal pulse.

17. The pulse width controlling logic circuit as claimed in claim 13, wherein said peak level converting unit includes an analog-to-digital converter, a digital processing circuit and a digital-to-analog converter in a cascade connection.

18. The pulse width controlling logic circuit as claimed in claim 13, wherein said pulse width controlling unit is controlled via a circuit for limiting variation in the power supply voltage.

19. The pulse width controlling logic circuit as claimed in claim 13, wherein an amplitude of the output signal from said integrating circuit is set in accordance with an operating voltage range of said pulse width controlling unit.

20. A pulse width controlling logic circuit comprising:
a pulse width controlling unit;
an integrating circuit for integrating an input signal supplied thereto;
a capacitor;
a peak level detecting unit supplied with an output signal from said pulse width controlling unit via said capacitor; and
a peak level converting unit,
wherein
said pulse width controlling unit is provided with a logic element having an input threshold level that depends on a power supply voltage applied to the logic element,
said peak level converting unit is supplied with an output signal from said peak level detecting circuit and converts the output signal from said peak level detecting circuit into a control signal,
the control signal from said peak level converting unit is applied to said pulse width controlling unit so as to control the power supply voltage applied to the logic element in accordance with a level of the output signal from said peak level detecting unit, and
the logic element converts an output signal from said integrating circuit into a pulse signal having a pulse width commensurate with the power supply voltage controlled by said pulse width controlling unit.

21. The pulse width controlling logic circuit as claimed in claim 20, wherein a low-pass filter is provided to precede said capacitor.

22. The pulse width controlling logic circuit as claimed in claim 20, wherein a low-pass filter is provided to follow said capacitor.

23. The pulse width controlling logic circuit as claimed in claim 20, wherein said peak level converting unit is provided with an operational amplifier, an input of said operational amplifier being supplied with the output signal from said peak level detecting unit and another input of said operational amplifier being connected to a reference potential, and said reference potential has a level equal to a level of the output signal from said peak level detecting unit occurring when the input pulse signal is an ideal pulse, the peak level converting unit may be provided with an operational amplifier, an input of said operational amplifier being supplied with the output signal from said peak level detecting unit and another input of said operational amplifier being connected to a reference potential, and said reference potential has a level equal to a level of the output signal from said peak level detecting unit occurring when the input pulse signal is an ideal pulse.

24. The pulse width controlling logic circuit as claimed in claim 20, wherein said peak level converting unit includes an analog-to-digital converter, a digital processing circuit and a digital-to-analog converter in a cascade connection.

25. The pulse width controlling logic circuit as claimed in claim 20, wherein said pulse width controlling unit is controlled via a circuit for limiting variation in the power supply voltage.

26. The pulse width controlling logic circuit as claimed in claim 20, wherein an amplitude of the output signal from said integrating circuit is set in accordance with an operating voltage range of said pulse width controlling unit.

* * * * *